United States Patent
Yang

(10) Patent No.: US 12,354,641 B2
(45) Date of Patent: Jul. 8, 2025

(54) MEMORY DEVICES SELECTING AND PROTECTING A POSSIBLE ATTACKED WORD LINE BASED ON THE PREVIOUS REFRESHED WORD LINES AND THE RELEVANT METHODS

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 134 days.

(21) Appl. No.: 18/514,043

(22) Filed: Nov. 20, 2023

(65) Prior Publication Data
US 2025/0166687 A1    May 22, 2025

(51) Int. Cl.
G11C 11/406    (2006.01)
G11C 11/408    (2006.01)

(52) U.S. Cl.
CPC .. G11C 11/40622 (2013.01); G11C 11/40615 (2013.01); G11C 11/4085 (2013.01)

(58) Field of Classification Search
CPC ........ G11C 11/40622; G11C 11/40615; G11C 11/4085
USPC ........................................................ 365/222
See application file for complete search history.

(56) References Cited

U.S. PATENT DOCUMENTS

2020/0167290 A1*  5/2020  Oh ..................... G11C 13/0059
2023/0326511 A1   10/2023  Oh

FOREIGN PATENT DOCUMENTS

| CN | 106685909 A | * | 5/2017 | ......... G06F 13/1673 |
| TW | I793028 B | | 2/2023 | |
| TW | 202326726 A | | 7/2023 | |
| TW | I809719 B | | 7/2023 | |
| WO | WO2016083865 A1 | | 6/2016 | |

OTHER PUBLICATIONS

Summary translation of Office Action and and the search report mailed on Jan. 8, 2025 related to Taiwanese Application No. 113102754.

* cited by examiner

Primary Examiner — Fernando Hidalgo
(74) Attorney, Agent, or Firm — Xuan Zhang

(57) ABSTRACT

A memory device and a method for protecting the same are provided. The memory device includes a controller configured to refresh a first word line and a first protected word line during a first refresh cycle in response to a refresh signal, a random number generator configured to receive an address of the first word line and an address of the first protected word line to generate a first number, a counter electrically coupled to the random number generator. The counter is configured to receive the first number as an initial value of the counter, and configured to be turned on in response to the refresh signal. The controller is configured to obtain an address of a second accessed word line being accessed when the counter counts down to zero, and refresh a second protected word line, adjacent to the second accessed word line, during a second refresh cycle.

20 Claims, 11 Drawing Sheets

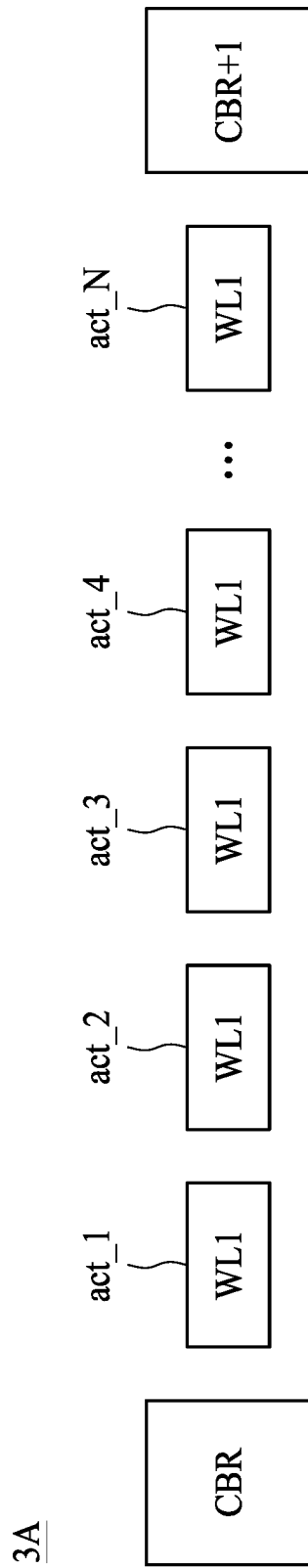

MEMORY DEVICES SELECTING AND PROTECTING A POSSIBLE ATTACKED WORD LINE BASED ON THE PREVIOUS REFRESHED WORD LINES AND THE RELEVANT METHODS

TECHNICAL FIELD

The present disclosure relates to a memory device and a method of protecting the same, and more particularly, to a memory device including a protection circuit for protecting a word line.

DISCUSSION OF THE BACKGROUND

Dynamic random access memory (DRAM) stores each bit of data in a separate capacitor. A simple DRAM cell comprises a single transistor and a single capacitor. If charges are stored in the capacitor, the cell is said to store a logic HIGH, depending on the convention used. Then if no charge is present, the cell is said to store a logic LOW. Since the charges in the capacitor dissipate over time, DRAM systems require additional refreshing circuitry to periodically refresh the charges stored in the capacitors. Since a capacitor can store only a very limited amount of charges, in order to quickly distinguish the difference between a logic "1" and a logic "0", two bit-lines (BLs) are typically used for each bit, wherein the first in the bit line pair is known as a bit line true (BLT) and the other is the bit line complement (BLC). The single transistor's gate is controlled by a word line (WL).

Row hammer is a security issue originating with an unintended and undesirable side effect of DRAM, in which memory cells interact electrically among themselves by leaking their charges, potentially changing the content of nearby memory rows (word lines) not addressed in the original memory access. Row hammer can be triggered by specific memory access patterns that rapidly activate the same memory rows (word lines) multiple times. Accordingly, the memory cells connected to the adjacent word lines leak charges and have difficulty retaining original content through subsequent periodical refresh cycles. A malicious operator can use row hammer effect to change the content of nearby memory rows, resulting in device malfunction. Thus, it is called for to develop an approach of protecting a memory device (particularly, word lines thereof) to alleviate the problems described.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device. The memory device includes a plurality of word lines and a controller configured to refresh a first word line and a first protected word line of the plurality of word lines during a first refresh cycle in response to a refresh signal, wherein the first protected word line is adjacent to a first accessed word line. The memory device further includes a random number generator configured to receive an address of the first word line and an address of the first accessed word line to generate a first number, and a counter electrically coupled to the random number generator. The counter is configured to receive the first number as an initial value of the counter, and configured to be turned on in response to the refresh signal. The controller is further configured to obtain an address of a second accessed word line accessed when the counter counts down to zero, and refresh a second protected word line during a second refresh cycle, wherein the second protected word line is adjacent to the second accessed word line.

Another aspect of the present disclosure provides a memory device. The memory device includes a plurality of word lines, a controller configured to refresh a first word line and adjacent word lines of a first accessed word line of the plurality of word lines during a first refresh cycle in response to a refresh signal, a random number generator configured to generate a first number based on the address of the first word line and the address of the first accessed word line, a counter electrically coupled to the random number generator, wherein the counter is configured to receive the first number as an initial value of the counter, and start counting down in response to the refresh signal, and an address register electrically coupled to the counter, wherein the address register is configured to store an address of a second accessed word line being active when the counter counts down to zero. The controller is configured to access the address register to obtain the address of the second accessed word line, and protect adjacent word lines of the second accessed word line during a second refresh cycle.

Another aspect of the present disclosure provides a method for protecting a memory device, wherein the memory device includes a plurality of word lines. The method includes refreshing a first word line and a first protected word line of the plurality of word lines during a first refresh cycle in response to a refresh signal, wherein the first protected word line is adjacent to a first accessed word line; generating a first number by a random number generator based on an address of the first word line and an address of the first accessed word line; starting counting down from the first number by a counter in response to the refresh signal; obtaining, by a controller, an address of a second accessed word line being accessed when the counter counts to zero; protecting a second protected word line during a second refresh cycle, wherein the second protected word line is adjacent to the second accessed word line.

The embodiments of the present disclosure provide a memory device having a protection circuit for selecting and protecting a vulnerable word line. In particular, the protection circuit of the memory device can protect the word lines (memory cells) from row hammer. To trigger the row hammer, the malicious operator rapidly activates the same memory rows, such that the charges on adjacent memory rows that are not activated may leak. The present protection circuit provides a random number generator and a counter, so as to randomly select and protect a possible attacked memory row. The counter can be configured to count down from a random number generated by the random number generator. When the counter reaches zero, an address of the memory row that is activated can be obtained. In other words, the memory row is selected from those activated between refresh cycles. In such a case, the selection pool includes the memory rows activated between refresh cycles. The random number generator can generate the random number based on the address of the last refreshed word line address and the address of the last accessed word line (the selected possible attacked word line), such that the unpredictability of the random number can increase. In addition, to avoid the random number generated by the random number generator exceeding the maximum number of activations between refresh cycles, the number trimmer modifies the random number to be in a range from zero to a predetermined number (i.e., the maximum number of activations between refresh cycles). Because the memory rows adjacent to the activated memory rows have a higher possibility of experiencing row hammer effect, they will be protected in the subsequent refresh cycle.

Generally, the activation amount triggering row hammer cannot be accomplished within two refresh cycles. For example, a memory device with 8192 rows can have about 170 activations between refresh cycles, and the activation amount for triggering the row hammer may be 10000 or more in the same row. Therefore, protecting additional memory rows possibly experiencing row hammer in every refresh cycle can eliminate the row hammer issue. Furthermore, the memory device can include a number trimmer to determine whether the random number, for choosing one among memory rows, exceeds the maximum number of activations between refresh cycles (i.e., 170 in this case), and then decrease the random number to be 0 to 170. Accordingly, security and performance of the memory device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 3A is a schematic diagram illustrating accessed word line address at each activation between refresh cycles along a timeline, in accordance with some embodiments of the present disclosure.

DETAILED DESCRIPTION

Figure 1:
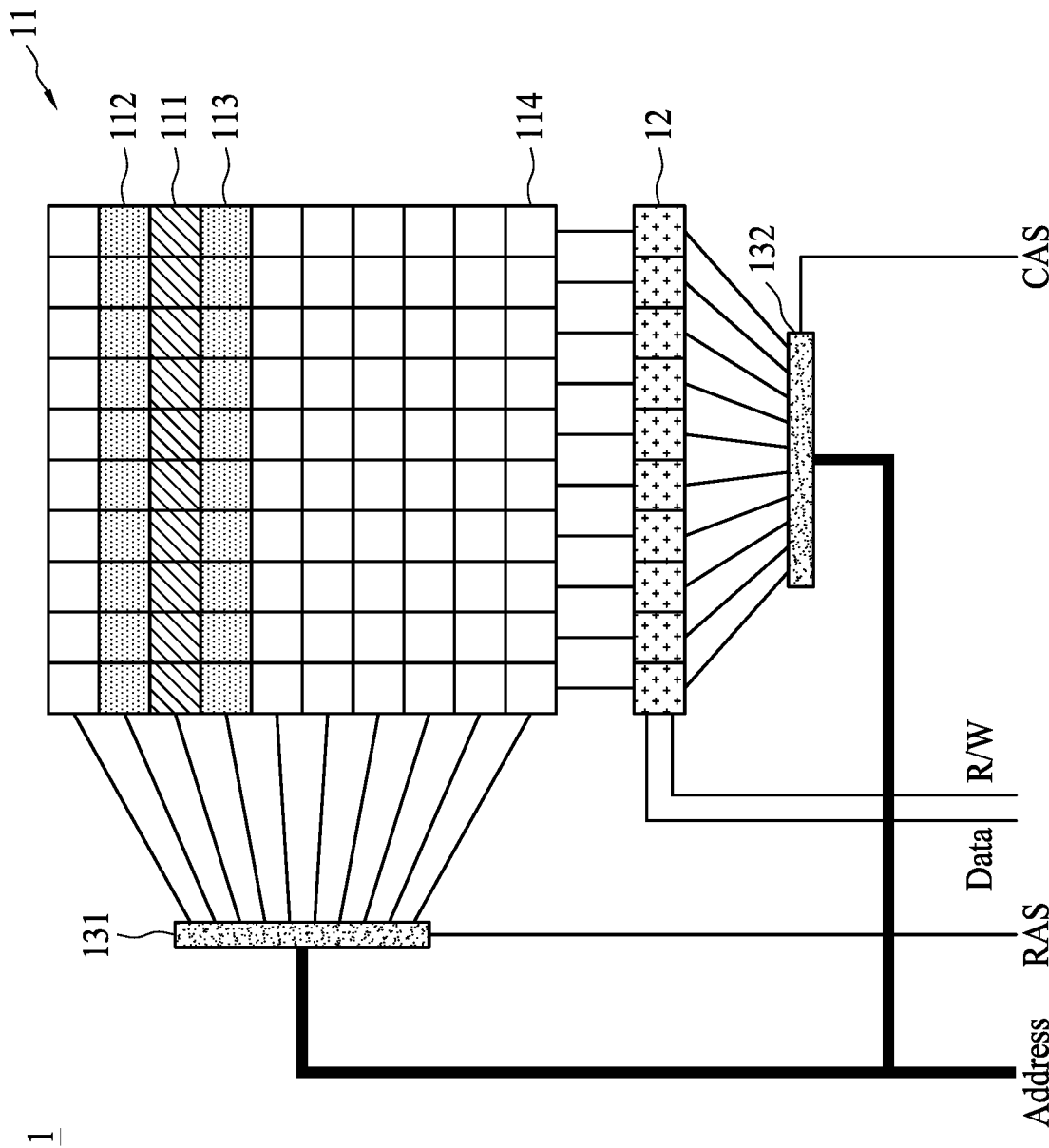
FIG. 1 is a schematic diagram of a memory device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a schematic diagram of a memory device 1, in accordance with some embodiments of the present disclosure. The memory device 1 can include an array of memory cells 11, sense amplifiers 12, a row address decoder 131, and a column address decoder 132. In some embodiments, the memory device 1 can be a DRAM.

Referring to FIG. 1, the array of memory cells 11 can include multiple rows and columns. Each column of memory cells can share one bit line or a pair of bit lines. Each row of memory cells can share one word line. In some embodiments, a single memory cell can include a capacitor and a transistor, and be configured to store a bit of data therein. The charge state of a capacitor (charged or discharged) can determine whether such memory cell stores "1" or "0" as a binary value.

In some embodiments, the memory address of the array of memory cells 11 applied to a matrix can be expressed as the row address and column address, which are processed by the row address decoder 131 and column address decoder 132. When the row address decoder 131 selects a particular row (for example, memory row 114) for a read operation (the selection is also known as row activation), bits from all memory cells in the particular row can be transferred into the sense amplifiers 12. In some embodiments, one sense amplifier 12 is for each column of memory cells to temporarily hold the data. In some embodiments, the column address decoder 132 can select the exact bit from one of the sense amplifiers 12. In some embodiments, the sense amplifiers 12 can be configured to receive or transmit the data in response to the read/write signal R/W. Write operations decode the addresses in a similar way, but entire rows can be rewritten for the value of a single bit to be changed.

Due to storing data bits in capacitors that have a natural discharge rate, the state stored in the memory cells 11 may lose over time and thus periodic rewriting of all memory cells is required, which is a process known as refreshing, in order to preserve the information stored on the memory cells. Each memory refresh cycle can refresh one or more rows of memory cells, and all the memory cells can be refreshed repeatedly in a consecutive cycle. The memory refresh can be accomplished in multiple types. In some embodiments, the memory refresh can be conducted by different patterns of signals, such as row address strobe (RAS) refresh, column-address-strobe-before-row-address-strobe (CAS-before-RAS) refresh (also called CBR refresh for short), and hidden refresh.

To trigger the row hammer, the same memory row 111 can be activated in a high frequency and amount. When the frequency and amount of activation to the memory row 111 is great enough, charges on the adjacent memory rows 112 and 113 that are not activated may leak and thus the data/content stored therein may lose.

The present protection circuit provides a random number generator and a counter (detailed description thereof can be found in FIG. 3), so as to randomly select and protect a possible memory row. The counter can be configured to count down from a random number generated by the random number generator. When the counter reaches zero, an address of the memory row (such as the memory row 111) that is activated can be obtained. In other words, the memory row is selected from those activated between refresh cycles. The nearby memory rows 112 and 113 adjacent to the activated memory row 111 have a higher possibility of experiencing row hammer effect, and thus they will be protected in the subsequent refresh cycle. In some embodiments, the memory rows 112 and 113 and a planned refresh memory row 114 can be refreshed in the subsequent refresh cycle.

Figure 2:
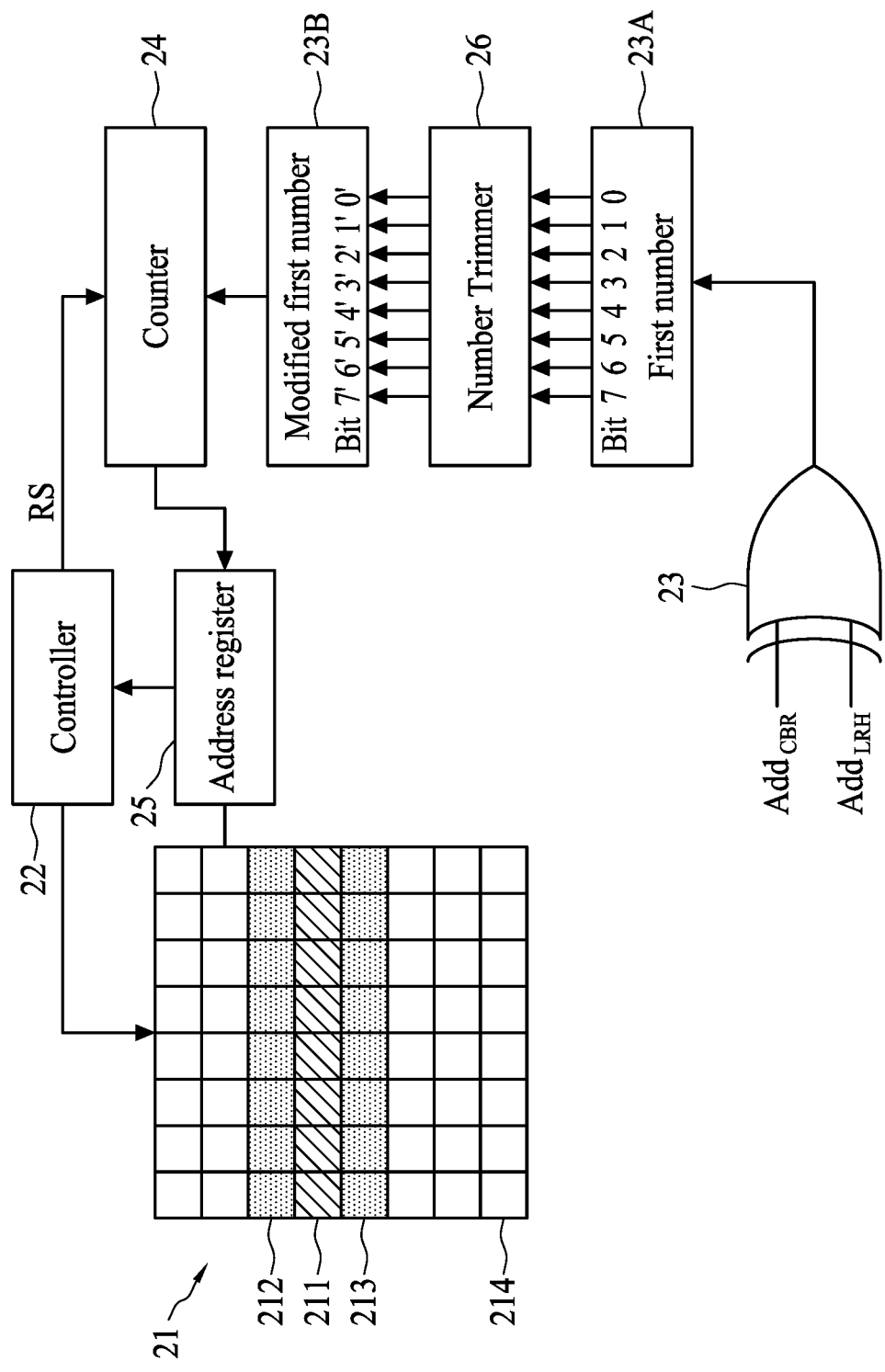
FIG. 2 is a schematic diagram of a memory device, in accordance with some embodiments of the present disclosure.

FIG. 2 is a schematic diagram of a memory device 2, in accordance with some embodiments of the present disclosure. Referring to FIG. 2, the memory device 2 can include an array of memory cells 21, a controller 22, a random number generator 23, a counter 24, an address register 25, and a number trimmer 26. In some embodiments, the memory device 2 can be a dynamic random-access memory (DRAM).

In some embodiments, the array of memory cells 21 can include a plurality of word lines. In some embodiments, the array of memory cells 21 can include a possible target word line 211 being accessed, i.e., the row hammer target, two adjacent word lines 212 and 213 adjacent to the possible target word line 211, and a normal word line 214. The normal word line 214 can be located anywhere in the array 21. For example, the normal word line 214 can be the edge word line or a word line sandwiched by two word lines. In one embodiment, the normal word line 214 can be separate from the possible target word line 211. In another embodiment, the normal word line 214 can be adjacent to the possible target word line 211 (not shown).

The controller 22 can be configured to refresh at least one of the word lines during a first refresh cycle by providing a refresh signal RS. In some embodiments, the refresh signal RS may be generated by the controller 22 itself based on a clock signal. In another embodiment, the controller 22 can be configured to refresh at least one of the word lines during a first refresh cycle in response to a refresh signal RS. In such embodiments, the controller 22 may receive the refresh signal RS from other elements (not shown). In some embodiments, the refresh signal RS can be RAS refresh command or CBR refresh command. The controller 22 can be configured to refresh one or more word lines during one refresh cycle. In some embodiments, the controller 22 can be configured to refresh one, two, three, four, or more word lines at the same time. In some embodiments, the controller 22 can be configured to refresh all of the array of memory cells 21 cycle by cycle. In some embodiments, the controller 22 can be configured to refresh all of the array of memory cells 21 in a predetermined pattern, i.e., a refresh pattern.

The random number generator 23 can be configured to generate a first number 23A. The first number 23A can be a positive integer. In some embodiments, the first number 23A can be in binary. The first number 23A can be represented by a binary sequence having more than 2 bits. For example, the first number 23A can be represented by a binary sequence having 8 bits. That is, the first number 23A can be a number in a range of 0 to 255. In other embodiments, the first number 23A can be more or less than 8 bits.

Referring to FIG. 2, the random number generator 23 can include a logic gate. The logic gate 23 can include OR gates, AND gates, XOR gates, XNOR gates and so on. In some embodiments, the random number generator 23 can be a XOR gate.

In some embodiments, the logic gate 23 can have a first input terminal, a second input terminal, and an output terminal. In some embodiments, the logic gate 23 can be configured to receive, at the first input terminal, an address of the word line $Add_{CBR}$ refreshed in the previous refresh cycle. The logic gate 23 can be configured to receive an address of the accessed word line $Add_{LRH}$, i.e., the possible target row hammer word line located in the previous refresh cycle, at the second terminal. In some embodiments, the logic gate 23 can be configured to generate the first number 23A in response to the address of the word line $Add_{CBR}$ and the address of the accessed word line $Add_{LRH}$.

In some embodiments, the address of the word line $Add_{CBR}$ and the address of the accessed word line $Add_{LRH}$ can each be represented by a hexadecimal sequence having 4 bits. The address of word lines represented by a hexadecimal sequence having 4 bits can be converted to a binary sequence having 16 bits.

In some embodiments, the logic gate 23 can be configured to generate the first number 23A based on a part of the address of the word line $Add_{CBR}$ and a part of the address of the accessed word line $Add_{LRH}$. In some embodiments, when the address of the word line $Add_{CBR}$ is represented in hexadecimal sequence of 4 bits, the part of the address of the word line $Add_{CBR}$ can be 2 bits, i.e., a half of the total bit length. In other embodiments, the part of the address of the word line $Add_{CBR}$ can be the last 2 bits no matter the total bit length. In some embodiments, the address of the word line $Add_{CBR}$ in hexadecimal can be converted to binary. In some embodiments, the 2 bits in hexadecimal of the address of the word line $Add_{CBR}$ can be converted to 8 bits in binary.

In some embodiments, when the address of the accessed word line $Add_{LRH}$ is represented in hexadecimal sequence of 4 bits, the part of the address of the accessed word line $Add_{LRH}$ can be 2 bits, i.e., a half of the total bit length. In other embodiments, the part of the address of the accessed word line $Add_{LRH}$ can be the last 2 bits irrespective of the total bit length. In some embodiments, the address of the accessed word line $Add_{LRH}$ in hexadecimal can be converted to binary. In some embodiments, the 2 bits in hexadecimal of the address of the accessed word line $Add_{LRH}$ can be converted to 8 bits in binary.

The taken parts of the word line $Add_{CBR}$ and the accessed word line $Add_{LRH}$ for the random number generator 23 can have the same bit length. In some embodiments, the taken bits of the word line $Add_{CBR}$ and the accessed word line $Add_{LRH}$ for the random number generator 23 can be determined according to the size of the memory array.

In some embodiments, the output terminal of the random number generator 23 can be coupled to the counter 24. The random number generator 23 can output the first number 23A at the output terminal to the counter 24.

The random number generator 23 can be configured to generate a random number (i.e., the first number 23A) in response to the address of the word line $Add_{CBR}$ and the address of the accessed word line $Add_{LRH}$. Although the word line $Add_{CBR}$ may be predetermined according to the refresh pattern, the accessed word line $Add_{LRH}$ can be randomly chosen from the memory array. Therefore, the first number 23A can be harder to predict. Accordingly, the security of the memory device 2 can be improved.

The number trimmer 26 can be connected to the random number generator 23 and configured to receive the first number 23A. The number trimmer 26 can be a circuit decreasing the first number 23A to less than a threshold. In some embodiments, the number trimmer 26 can be configured to generate a modified first number 23B (or a second number 23B) according to the first number 23A. In some embodiments, the first number 23A can be modified by the number trimmer 26 to the modified first number 23B when the first number 23A is greater than a first predetermined number. In some embodiments, the first predetermined number is the maximum accessing number between refresh cycles (detailed description thereof can be found in FIG. 3). After modification, the modified first number 23B is less than the first predetermined number. The modified first number 23B can be less than the first number 23A.

Figure 3:
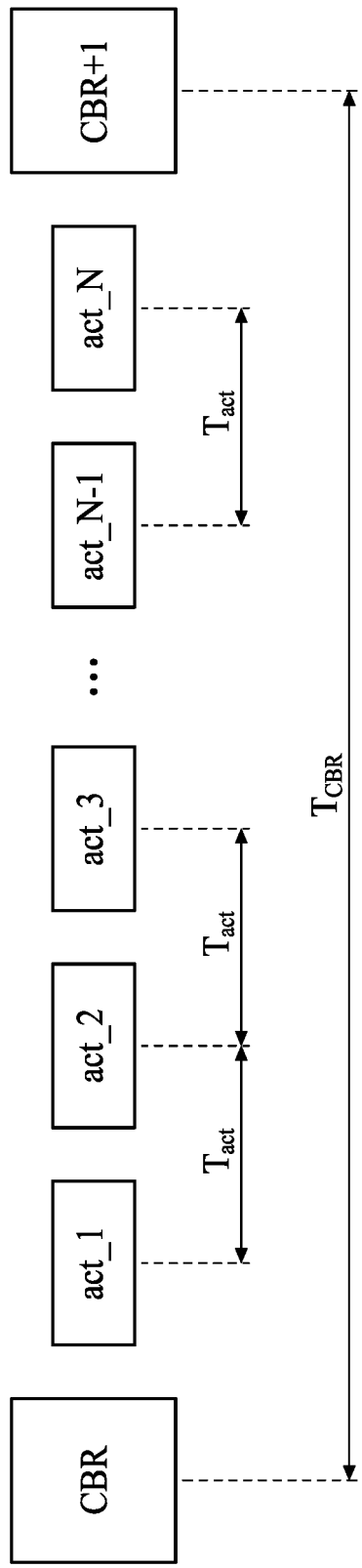
FIG. 3 is a schematic diagram illustrating activation of word lines between refresh cycles along a timeline, in accordance with some embodiments of the present disclosure.

FIG. 3 is a schematic diagram 3 illustrating activation of word lines between refresh cycles along a timeline, in accordance with some embodiments of the present disclosure.

Referring to FIG. 3, along the timeline (i.e., the x-axis), a time period $T_{CBR}$ is between a first refresh cycle CBR and a second refresh cycle CBR+1. In some embodiments, the second refresh cycle CBR+1 is next to the first refresh cycle CBR. In some embodiments, each of the first refresh cycle CBR and the second refresh cycle CBR+1 may include a period for refreshing operation and also an idle period. The idle period mentioned here refers to the waiting time between the beginning of the refresh cycle CBR till the beginning of the refresh cycle CBR+1. Accordingly, the time period $T_{CBR}$ may be from the starting point of the first refresh cycle CBR to the starting point of the second refresh cycle CBR+1.

In some embodiments, a number N of activations (act_1, act_2, act_3, . . . , act_N−1, act_N) occurs between the first refresh cycle CBR and the second refresh cycle CBR+1. Each activation act_1, act_2, act_3, act_N−1, and act_N represent an access to a word line. The time period $T_{act}$ is between two activations. For example, the time period $T_{act}$ can be between the activations act_1 and act_2. In some embodiments, the time period $T_{act}$ can be the minimum essential time for accessing a word line (such as the first activation act_1).

To clearly elaborate the present disclosure, a memory array having 8 k of word lines is used as an example. The memory array can include 8192 word lines. The address of the word lines may be represented by a hexadecimal sequence, such as with 4 bits. In some embodiments, the time for refreshing all word lines (i.e., 8192 word lines) can be 64 ms. In such a case, the time period $T_{CBR}$, which is the time needed to refresh one word line, can be calculated as 64 ms/8192, and thus the time period $T_{CBR}$ would be 7.8125 μs. In other words, the time period $T_{CBR}$, from the starting point of the first refresh cycle to the starting point of the second refresh cycle, can be 7.8125 μs for a total 8 k word lines. Assuming the time period $T_{act}$ of 45.75 ns, the maximum accessing number $N_{max}$ between refresh cycles can be calculated according to the equation $$N_{max} = \frac{T_{CBR}}{T_{act}}.$$

Therefore, the maximum accessing number $N_{max}$ can be 7.8125 μs/45.75 ns=170.765≈170, which means the number N in FIG. 3 is 170. There can be 170 word lines accessed between refresh cycles in this embodiment. Accordingly, the first number 23A received by the counter 24 can be modulated to under a predetermined number (for example, 170 in this embodiment).

In some embodiments, the first number 23A can be less than a predetermined number, which is associated with the time period $T_{act}$ for accessing a word line and the time period $T_{CBR}$ between the first refresh cycle CBR and the second refresh cycle CBR+1. In some embodiments, the counter 24 can be configured to reset the initial value when the first number 23A is greater than the predetermined number. For example, the initial value of the counter 24 can be reset to zero or to a constant less than the predetermined number. Accordingly, the counter 24 can start counting down from the initial value that is in a range of 0 to the predetermined number (i.e., the maximum accessing number between refresh cycles), and when decrementing to zero, a word line can be selected to be protected during the subsequent refresh cycle.

Referring again to FIG. 2, the modified first number 23B can be represented in a form identical to that of the first number 23A. In some embodiments, the first number and the modified number can both be binary. For example, if the first number 23A is represented by a binary sequence having 8 bits, the modified first number 23B is also represented by a binary sequence having 8 bits. In some embodiments, the first number 23A can be represented in a binary sequence having Bit7, Bit6, Bit5, Bit4, Bit3, Bit2, Bit1, and Bit0. The modified first number 23B can be represented in a binary sequence having Bit7', Bit6', Bit5', Bit4', Bit3', Bit2', Bit1', and Bit0'.

The difference between the first number 23A and the modified first number 23B can be one bit of the binary sequence. For example, a most significant bit (msb) of the first number 23A can be different from that of the modified first number 23B. That is, Bit7' of the modified first number 23B is different from Bit7 of the first number 23A. In some embodiments, Bit6' to Bit0' of the modified first number 23B can be identical to Bit6 to Bit0 of the first number 23A. In another embodiment, the modified first number 23B can be reset to zero by the number trimmer 26. Accordingly, Bit7' to Bit0' of the modified first number 23B are logic "0".

On the contrary, when the first number 23A is less than the first predetermined number, the number trimmer 26 will take no action on the first number 23A. In such a case, the modified first number 23B would be identical to the original first number 23A.

The counter 24 can be electrically coupled to the random number generator 23 and the number trimmer 26. In some embodiments, the counter 24 can be electrically coupled to the random number generator 23 through the number trimmer 26. The counter 24 can be configured to receive the modified first number 23B as an initial value of the counter 24. In one embodiment, when the first number 23A is less than the first predetermined number, the modified first number 23B is identical to the first number 23A, and the counter 24 decrements from the modified first number 23B (i.e., the first number 23A). In another embodiment, when the first number 23A is greater than the first predetermined number, the first number 23A is modified to the modified first number 23B, which is less than the first predetermined number, and the counter 24 decrements from the modified first number 23B, which is different from the first number 23A.

In some embodiments, the counter 24 is configured to be turned on in response to the refresh signal RS received from the controller 22. In other words, the counter 24 can be configured to start counting down in response to the refresh signal RS. The counter 24 can be configured to decrement from the initial value, i.e., the first number 23A or the modified first number 23B.

In some embodiments, the counter 24 can be configured to decrement in response to an accessing signal, indicative of an access to one of the word lines.

The address register 25 can be electrically coupled to the counter 24. The address register 25 can be configured to obtain an address of a first word line 211 (or the possible target word line 211) that is active when the counter 24 decrements to zero, and store the address.

FIG. 3A is a schematic diagram 3A illustrating accessed word line address at each activation between refresh cycles CBR and CBR+1 along a timeline, in accordance with some embodiments of the present disclosure.

Referring to FIG. 3A, the word line address WL1 is accessed at every activations act_1, act_2, act_3, act_4, . . . , and act_N. In such a case, no matter the initial value of the counter 24, the address register 25 stores the word line address WL1, accessed the most. In other words, the word line address WL1 can be the most possible target of the malicious operator. Therefore, selecting the word lines adjacent to the word line address WL1 to be protected can prevent row hammer.

Figure 3B:
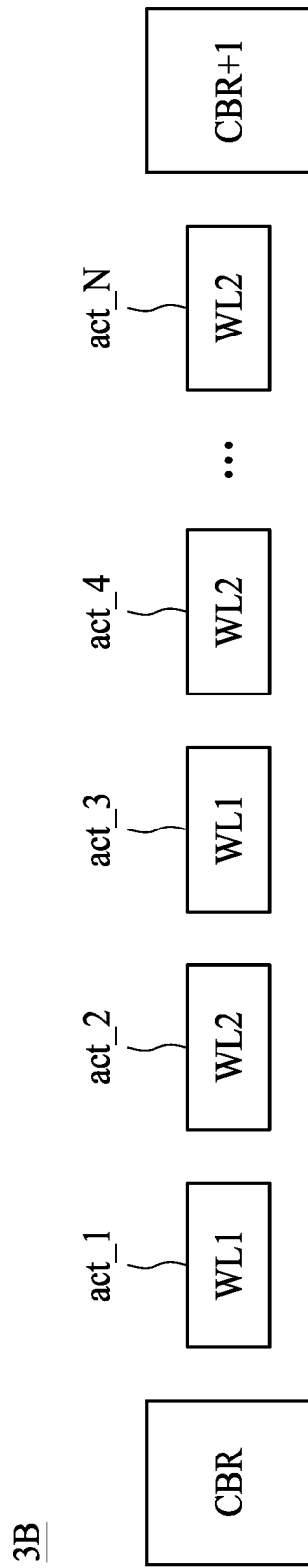
FIG. 3B is a schematic diagram illustrating accessed word line address at each activation between refresh cycles along a timeline, in accordance with some embodiments of the present disclosure.

FIG. 3B is a schematic diagram 3B illustrating accessed word line address at each activation between refresh cycles CBR and CBR+1 along a timeline, in accordance with some embodiments of the present disclosure.

Referring to FIG. 3B, the word line address WL1 is accessed at the activation act_1. The word line address WL2 is accessed at the activation act_2. The word line address WL1 is accessed at the activation act_3. The word line address WL2 is accessed at the activation act_4. The word line address WL2 is accessed at the activation act_N. That is, only word line addresses WL1 and WL2 are accessed. In such a case, no matter the initial value of the counter 24, the address register 25 stores either the word line address WL1 or WL2, which are accessed the most. In some embodiments, the attacked possibility of the word line addresses WL1 and WL2 are both 50%. In other words, the word line addresses WL1 and WL2 can be the most possible target of the attacker. Therefore, selecting the word lines adjacent to the word line address WL1 or WL2 to be protected can prevent row hammer.

Figure 3C:
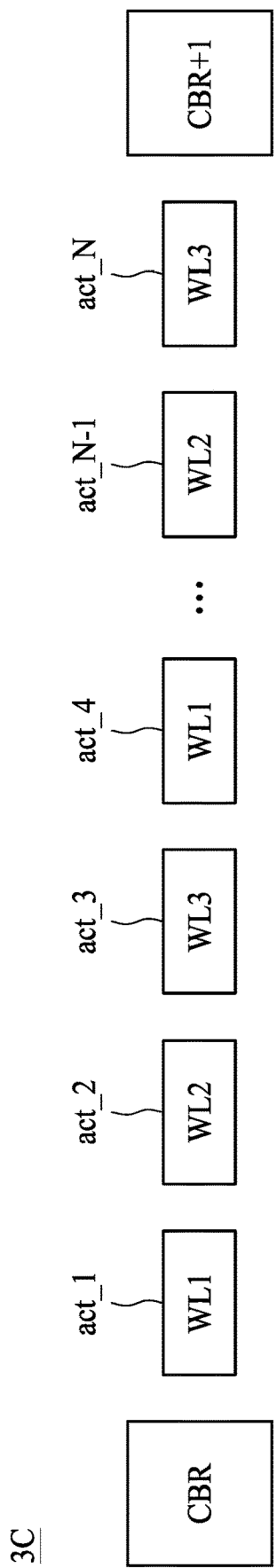
FIG. 3C is a schematic diagram illustrating accessed word line address at each activation between refresh cycles along a timeline, in accordance with some embodiments of the present disclosure.

FIG. 3C is a schematic diagram 3C illustrating accessed word line address at each activation between refresh cycles CBR and CBR+1 along a timeline, in accordance with some embodiments of the present disclosure.

Referring to FIG. 3C, the word line address WL1 is accessed at the activation act_1. The word line address WL2 is accessed at the activation act_2. The word line address WL3 is accessed at the activation act_3. The word line address WL1 is accessed at the activation act_4. The word line address WL2 is accessed at the activation act_N−1. The word line address WL3 is accessed at the activation act_N. In some embodiments, the word line addresses WL1, WL2, and WL3 are accessed in sequence repeatedly. That is, only word line addresses WL1, WL2, and WL3 are accessed between refresh cycles. In such a case, the address register 25 stores one of the word line addresses WL1, WL2, and WL3. In some embodiments, the attacked possibility of the word line addresses WL1, WL2, and WL3 may be about 33.33%. In other words, the word line addresses WL1, WL2, and WL3 can be the most possible target of the malicious operator. Therefore, selecting the word lines adjacent to the word line address WL1, WL2, or WL3 to be protected can prevent row hammer.

Referring to FIGS. 3A-3C, the address of the word line to be protected can be randomly selected from those word lines active during two refresh cycles. The word line is selected from those activated between refresh cycles. In such a case, the selection pool includes the word lines activated between refresh cycles.

Referring back to FIG. 2, the controller 22 can be configured to access the address register 25 to obtain the address of the first word line and protect a second word line 212/213 (i.e., the adjacent word line 212 or 213) during a second refresh cycle. To protect the second word line 212/213, the controller can be configured to refresh the second word line 212/213 during the second refresh cycle in response to the refresh signal. In some embodiments, the second refresh cycle follows the first refresh cycle. For example, the second refresh cycle is the subsequent refresh cycle of the first refresh cycle. In some embodiments, the second word line 212/213 is adjacent to the first word line 211.

The controller 22 can be configured to refresh one or more word lines during one refresh cycle. In some embodiments, the controller 22 can be configured to refresh one, two, three, four, or more word lines at the same time. The controller 22 can be configured to refresh both adjacent word lines 212 and 213 during the same refresh cycle. In some embodiments, in addition to the second word line 212/213, the controller 22 can be configured to refresh a third word line 214 during the second refresh cycle in response to the refresh signal RS, where the address of the third word line 214 is separate from the address of the first word line 211.

In some embodiments, the controller 22 can be configured to refresh one word line adjacent to the possible target word line 211 and another word line separate from the possible target word line 211. For example, the word line 212 and the word line 214 can be refreshed during the second refresh cycle. In some embodiments, in one refresh cycle, the controller 22 can be configured to refresh one normal word line (such as the word line 214) according to the predetermined refresh pattern and one high risk word line (such as the word line 212 or 213), which are determined by the random number generator 23 and the counter 24. That is, at least one normal refresh word line and at least one word line having high risk of row hammer effect can be refreshed in one refresh cycle simultaneously.

In the present disclosure, the address of the first word line 211 (or the possible target word line 211) that is active can be obtained when the counter 24 decrements to zero. In such case, the address of the word line to be protected can be randomly selected from those word lines active during two refresh cycles. In addition, the number trimmer 26 modifies the first number 23A to be in a range from zero to the first predetermined number, to avoid the first number 23A exceeding the maximum number of activations between refresh cycles.

Figure 4A:
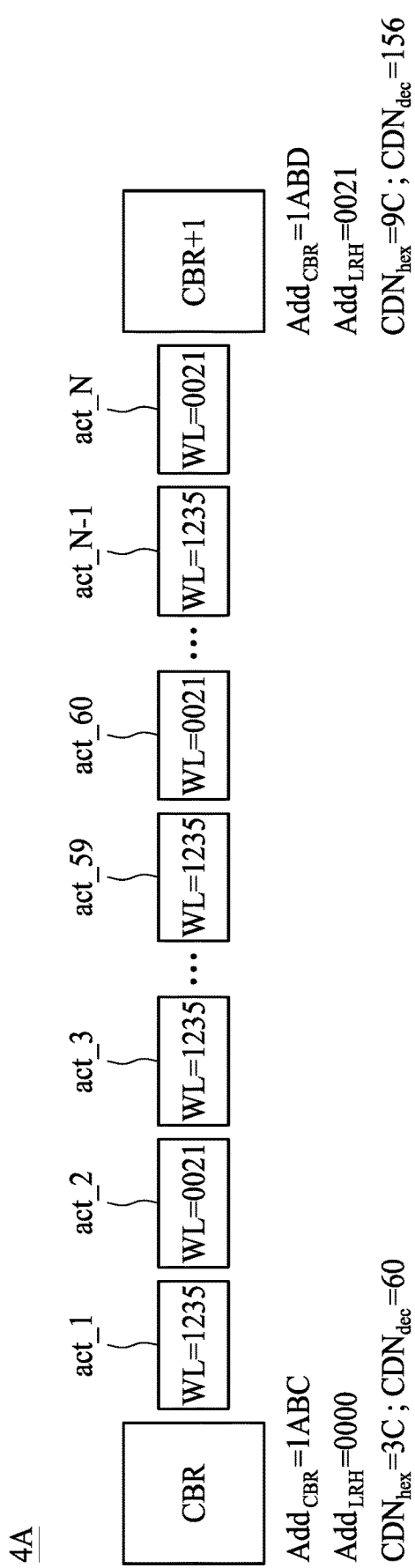
FIG. 4A is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4A is a schematic diagram 4A illustrating accessed word line address between refresh cycles CBR and CBR+1 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4A, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_59. The word line address WL of 0021 is accessed at the activation act_60. The word line address WL of 1235 is accessed at the activation act_N−1. The word line address WL of 0021 is accessed at the activation act_N. That is, only two word line addresses 1235 and 0021 are accessed. In some embodiments, the word line addresses in FIG. 4A are represented by a hexadecimal sequence having 4 bits. In other words, the word line address WL of 1235 in hexadecimal can be equivalent to 4661 in decimal, and to 0001001000110101 in binary. The word line address WL of 0021 in hexadecimal can be equivalent to 33 in decimal, and to 0000000000100001 in binary.

In the refresh cycle CBR, the refresh word line address $Add_{CBR}$ can be 1ABC for example. When the refresh cycle CBR is the initial refresh cycle, there is no previous refresh cycle and thus the possible target row hammer word line located address $Add_{LRH}$ (in the previous refresh cycle) can be 0000. The word line address WL of 1ABC in hexadecimal can be equivalent to 6844 in decimal, and to 0001101010111100. As discussed in FIG. 2, the random number generator 23 can be configured to generate the first number 23A in response to the last 2 bits of the refresh word line address $Add_{CBR}$ and the row hammer target word line address $Add_{LRH}$ in hexadecimal.

In response to the last 2 bits of the refresh word line address $Add_{CBR}$ being BC and the last 2 bits of the row hammer target word line address $Add_{LRH}$ being 00, the initial countdown number $CDN_{hex}$, i.e., the first number 23A (the initial number of the counter 24), can be 3C in hexadecimal according to the operation of the logic gate 23 (such as, XOR). In some embodiments, the initial countdown number $CDN_{hex}=3C$ can be equivalent to initial countdown number $CDN_{dec}=60$. In such a case, the counter 24 can count down from 60, and the address register 25 can be configured to obtain the word line address accessed at the activation act_60 between the refresh cycles CBR and CBR+1, i.e., WL of 0021. Accordingly, in the subsequent refresh cycle CBR+1, the row hammer target word line address $Add_{LRH}$ will be 0021. That is, the adjacent word lines of 0021 (such as the word line addresses 0020 or 0022) can be protected in the refresh cycle CBR+1.

In the refresh cycle CBR+1, the refresh word line address $Add_{CBR}$ can be 1ABD, and the row hammer target word line address $Add_{LRH}$ can be 0021. The word line address WL of 1ABD in hexadecimal can be equivalent to 6845 in decimal, and to 0001101010111101.

In response to the last 2 bits of the refresh word line address $Add_{CBR}$ being BD and the last 2 bits of the row hammer target word line address $Add_{LRH}$ being 21, the initial countdown number $CDN_{hex}$ can be 9C in hexadecimal according to the operation of the logic gate 23 (such as, XOR) in refresh cycle CBR+1. In some embodiments, the initial countdown number $CDN_{hex}=9C$ can be equivalent to initial countdown number $CDN_{dec}=156$. In such a case, the counter 24 can count down from 156, and the address register 25 can be configured to obtain the word line address accessed at the activation act_156 between the refresh cycles CBR+1 and CBR+2 (see FIG. 4B).

Figure 4B:
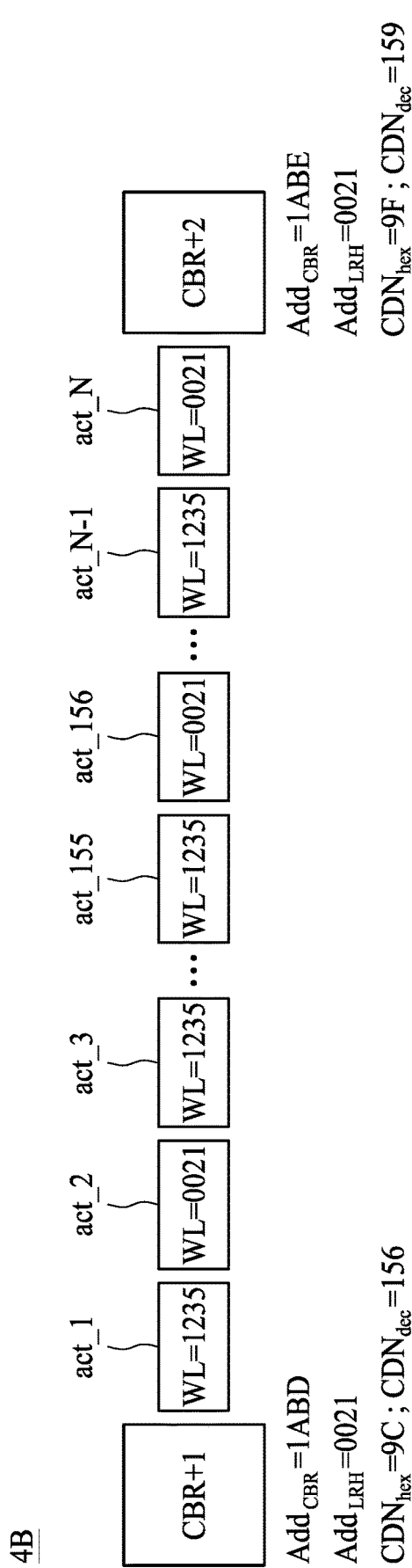
FIG. 4B is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4B is a schematic diagram 4B illustrating accessed word line address between refresh cycles CBR+1 and CBR+2 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4B, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_155. The word line address WL of 0021 is accessed at the activation act_156. The word line address WL of 1235 is accessed at the activation act_N−1. The word line address WL of 0021 is accessed at the activation act_N. That is, only two word line addresses 1235 and 0021 are accessed.

In the refresh cycle CBR+1, the refresh word line address $Add_{CBR}$ can be 1ABD, and the row hammer target word line address $Add_{LRH}$ can be 0021. As discussed in FIG. 4A, in response to the last 2 bits of the refresh word line address $Add_{CBR}$ being BD and the last 2 bits of the row hammer target word line address $Add_{LRH}$ being 21, the initial countdown number $CDN_{hex}$ can be 9C in hexadecimal in the refresh cycle CBR+1. In some embodiments, the initial countdown number $CDN_{hex}$=9C can be equivalent to initial countdown number $CDN_{dec}$=156. In such a case, the counter 24 can count down from 156, and the address register 25 can be configured to obtain the word line address accessed at the activation act_156 between the refresh cycles CBR+1 and CBR+2, i.e., WL of 0021. Accordingly, in the subsequent refresh cycle CBR+2, the row hammer target word line address $Add_{LRH}$ will also be 0021. That is, the adjacent word lines of 0021 (such as the word line addresses 0020 or 0022) can be protected in the refresh cycle CBR+2.

In the refresh cycle CBR+2, the refresh word line address $Add_{CBR}$ can be 1ABE, and the row hammer target word line address $Add_{LRH}$ can be 0021. The word line address WL of 1ABE in hexadecimal can be equivalent to 6846 in decimal, and to 0001101010111110.

In response to the last 2 bits of the refresh word line address $Add_{CBR}$ being BE and the last 2 bits of the row hammer target word line address $Add_{LRH}$ being 21, the initial countdown number $CDN_{hex}$ can be 9F in hexadecimal in refresh cycle CBR+2. In some embodiments, the initial countdown number $CDN_{hex}$=9F can be equivalent to initial countdown number $CDN_{dec}$=159. In such a case, the counter 24 can count down from 159, and the address register 25 can be configured to obtain the word line address accessed at the activation act_159 between the refresh cycles CBR+2 and CBR+3 (see FIG. 4C).

Figure 4C:
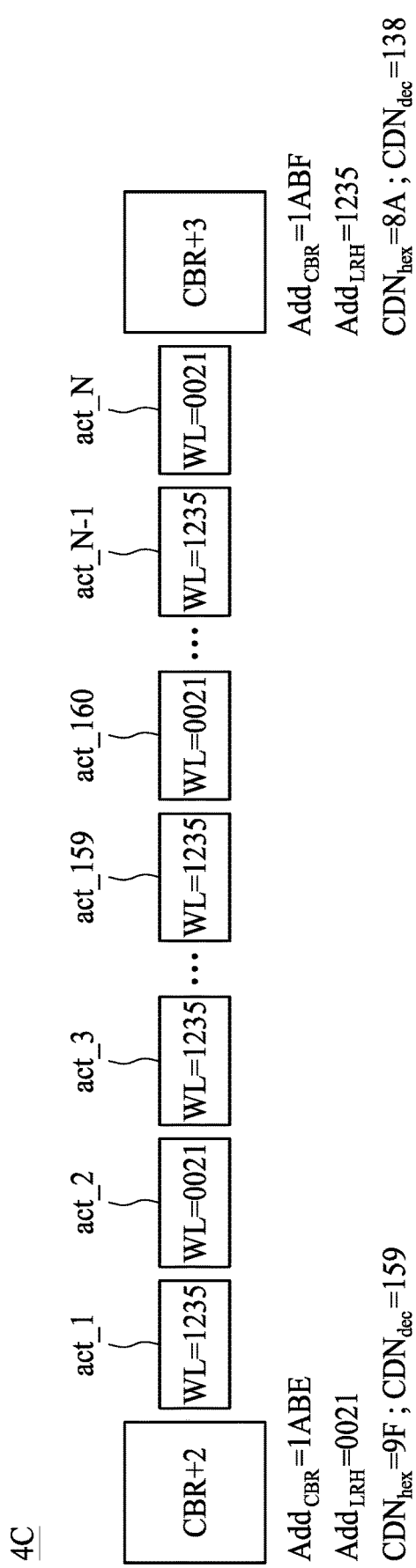
FIG. 4C is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4C is a schematic diagram 4C illustrating accessed word line address between refresh cycles CBR+2 and CBR+3 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4C, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_159. The word line address WL of 0021 is accessed at the activation act_160. The word line address WL of 1235 is accessed at the activation act_N−1. The word line address WL of 0021 is accessed at the activation act_N. That is, only two word line addresses 1235 and 0021 are accessed.

In the refresh cycle CBR+2, the refresh word line address $Add_{CBR}$ can be 1ABE, and the row hammer target word line address $Add_{LRH}$ can be 0021. As discussed in FIG. 4B, in response to the last 2 bits of the refresh word line address $Add_{CBR}$ being BE and the last 2 bits of the row hammer target word line address $Add_{LRH}$ being 21, the initial countdown number $CDN_{hex}$ can be 9F in hexadecimal in the refresh cycle CBR+2. In some embodiments, the initial countdown number $CDN_{hex}$=9F can be equivalent to initial countdown number $CDN_{dec}$=159. In such a case, the counter 24 can count down from 159, and the address register 25 can be configured to obtain the word line address accessed at the activation act_159 between the refresh cycles CBR+2 and CBR+3, i.e., WL of 1235. Accordingly, in the subsequent refresh cycle CBR+3, the row hammer target word line address $Add_{LRH}$ will also be 1235. That is, the adjacent word lines of 1235 (such as the word line addresses 1234 or 1236) can be protected in the refresh cycle CBR+3.

In the refresh cycle CBR+3, the refresh word line address $Add_{CBR}$ can be 1ABF, and the row hammer target word line address $Add_{LRH}$ can be 1235. The word line address WL of 1ABF in hexadecimal can be equivalent to 6847 in decimal, and to 0001101010111111.

In response to the last 2 bits of the refresh word line address $Add_{CBR}$ being BF and the last 2 bits of the row hammer target word line address $Add_{LRH}$ being 35, the initial countdown number $CDN_{hex}$ can be 8A in hexadecimal in refresh cycle CBR+3. In some embodiments, the initial countdown number $CDN_{hex}$=8A can be equivalent to initial countdown number $CDN_{dec}$=138. In such a case, the counter 24 can count down from 138, and the address register 25 can be configured to obtain the word line address accessed at the activation act_138 between the refresh cycles CBR+3 and CBR+4 (see FIG. 4D).

Figure 4D:
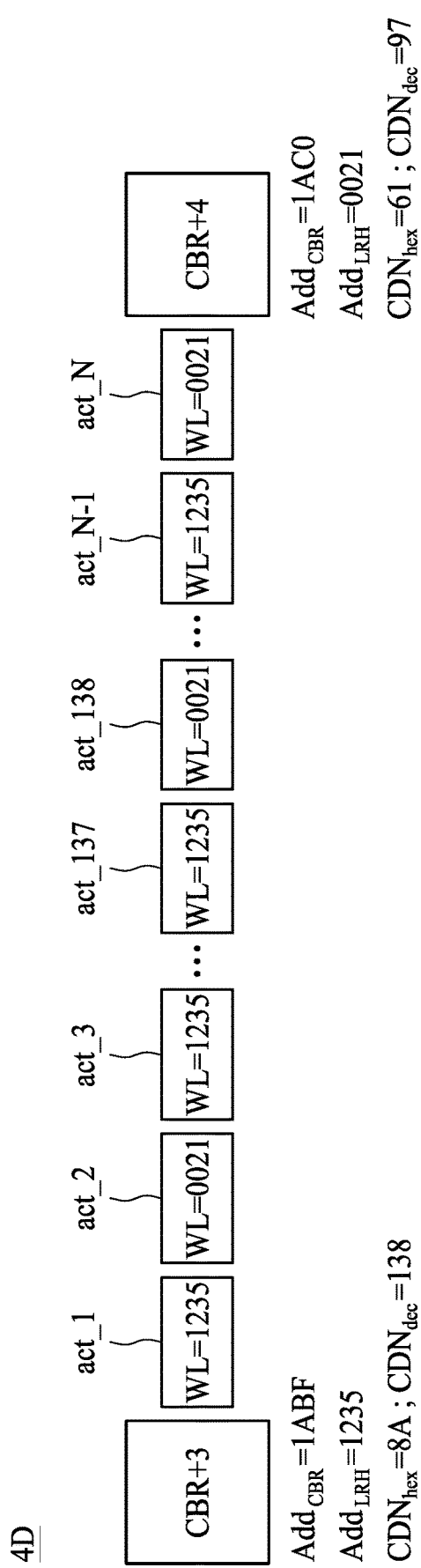
FIG. 4D is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4D is a schematic diagram 4D illustrating accessed word line address between refresh cycles CBR+3 and CBR+4 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4D, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_137. The word line address WL of 0021 is accessed at the activation act_138. The word line address WL of 1235 is accessed at the activation act_N−1. The word line address WL of 0021 is accessed at the activation act_N. That is, only word line addresses 1235 and 0021 are accessed.

In the refresh cycle CBR+3, the refresh word line address $Add_{CBR}$ can be 1ABF, and the row hammer target word line address $Add_{LRH}$ can be 1235. As discussed in FIG. 4C, in response to the last 2 bits of the refresh word line address $Add_{CBR}$ being BF and the last 2 bits of the row hammer target word line address $Add_{LRH}$ being 35, the initial countdown number $CDN_{hex}$ can be 8A in hexadecimal in the refresh cycle CBR+3. In some embodiments, the initial countdown number $CDN_{hex}$=8A can be equivalent to initial countdown number $CDN_{dec}$=138. In such a case, the counter 24 can count down from 138, and the address register 25 can be configured to obtain the word line address accessed at the activation act_138 between the refresh cycles CBR+3 and CBR+4, i.e., WL of 0021. Accordingly, in the subsequent refresh cycle CBR+4, the row hammer target word line address $Add_{LRH}$ will also be 0021. That is, the adjacent word lines of 0021 (such as the word line addresses 0020 or 0022) can be protected in the refresh cycle CBR+4.

In the refresh cycle CBR+4, the refresh word line address $Add_{CBR}$ can be 1AC0, and the row hammer target word line address $Add_{LRH}$ can be 0021. The word line address WL of 1AC0 in hexadecimal can be equivalent to 6848 in decimal, and to 0001101011000000.

For the refresh cycle CBR+4, in response to the last 2 bits of the refresh word line address $Add_{CBR}$ being C0 and the last 2 bits of the row hammer target word line address $Add_{LRH}$ being 21, the first number 23A can be E1 in hexadecimal, equivalent to 225 in decimal and equivalent to 11100001 in binary. In such a case, the first number 23A is greater than the first predetermined number (170), and thus the first number 23A will be modified by the number trimmer 26 to be the modified first number 23B. For example, the number trimmer 26 can be configured to reset the most significant bit (msb) of the first number 23A in binary. Therefore, the modified first number 23B can be 01100001, equivalent to 197 in decimal and equivalent to 61 in hexadecimal.

Accordingly, the initial countdown number $CDN_{hex}$ can be 61 in hexadecimal ($CDN_{dec}$=97) in refresh cycle CBR+4. In such a case, the counter 24 can count down from 97, and the address register 25 can be configured to obtain the word line address accessed at the activation act_97 between the refresh cycles CBR+4 and CBR+5 (not shown).

Referring to FIGS. 4A-4D, the address of the word line to be protected can be randomly selected from those word lines active during two refresh cycles. The word line is selected within those activated between refresh cycles. In such a case, the selection pool includes the word lines activated (i.e., the word line address of 0021 and 1235) between refresh cycles.

Figure 5:
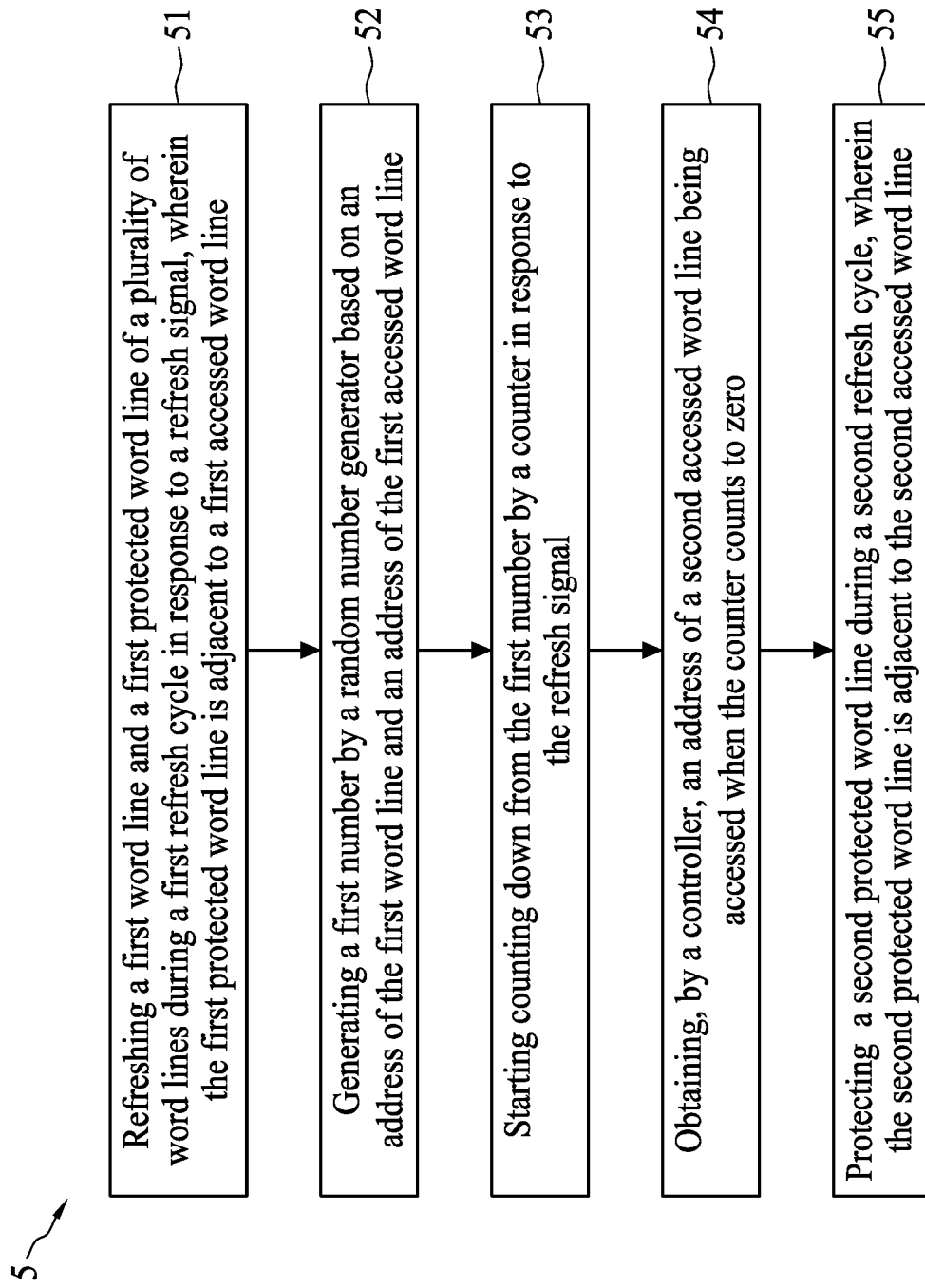
FIG. 5 is a flowchart of a method for protecting a memory device, in accordance with some embodiments of the present disclosure.

FIG. 5 is a flowchart of a method 5 for protecting a memory device, in accordance with some embodiments of the present disclosure. In some embodiments, the method 5 is for protecting a word line included in the memory device. In some embodiments, the memory device can include a plurality of word lines.

In operation 51, a first word line and a first protected word line of the plurality of word lines can be refreshed during a first refresh cycle in response to a refresh signal, wherein the first protected word line is adjacent to a first accessed word line. In some embodiments, the controller (for example, controller 22 in FIG. 2) of the memory device can refresh one or more word lines in each refresh cycle in response to the refresh signal. In some embodiments, in the first refresh cycle (for example, the refresh cycle CBR+2 in FIG. 4C), the controller can be configured to refresh one normal word line (such as the word line address 1ABE) according to the predetermined refresh pattern and one high-risk word line (such as the word line address 0020 or 0022, adjacent to the $Add_{LRH}$=0021). In some embodiments, the operation 51 can be performed by controller 22 in FIG. 2.

In operation 52, a first number can be generated by a random number generator based on an address of the first word line and an address of the first accessed word line. In some embodiments, the random number generator (for example, random number generator 23 in FIG. 2) can be configured to generate a random number based on a part of an address of the first word line and a part of an address of the first accessed word line. In some embodiments, the operation 52 can be performed by the random number generator 23 in FIG. 2.

In operation 53, a counter can start counting down from the first number in response to the refresh signal. In some embodiments, in response to the refresh signal, the counter can be configured to turn on to start counting. In some embodiments, each countdown is triggered by an accessing signal indicative of an access to one word line. In some embodiments, the operation 53 can be performed by the counter 24 shown in FIG. 2.

In operation 54, an address of a second accessed word line being accessed can be obtained by a controller when the counter counts to zero. In some embodiments, the address of the second accessed word line (for example, the word line address 1235 being accessed in the activation act_159 as shown FIG. 4C) can be obtained and stored in an address register (for example, the address register 25 shown in FIG. 2) when the counter decrements to zero. The controller (for example, controller 22 in FIG. 2) can be configured to access the address register and obtain the address of the second accessed word line. In some embodiments, the operation 54 can be performed by controller 22 with/without the address register 25 shown in FIG. 2.

In operation 55, a second protected word line can be protected during a second refresh cycle, wherein the second protected word line is adjacent to the second accessed word line. In some embodiments, the second protected word line can be refreshed during the second refresh cycle (for example, the word line address 1234 or 1236 can be refreshed during the refresh cycle CBR+3 as shown in FIG. 4C). In some embodiments, the operation 55 can be performed by controller 22 in FIG. 2.

To implement row hammer, a malicious operator tends to access one or more target word lines in a high frequency. The large amount of access to the target word line can lead to row hammer effect occurring on the word lines adjacent to the target word lines. That is, under the row hammer effect, content of nearby word lines may change by leaked charges, even if nearby word lines are not accessed.

The present disclosure provides a memory device that can determine a possible target word line to be attacked and protect word lines adjacent to the possible target word line. The random number generator can generate a random number to be an initial value of the counter, and the target word line address being accessed can be obtained when the counter reaches zero. In addition, to avoid the random number generated by the random number generator exceeding the maximum number of activations between refresh cycles, the number trimmer modifies the random number to be in a range from zero to a predetermined number (i.e., the maximum number of activations between refresh cycles). Accordingly, word lines adjacent to the frequently accessed target word line can be refreshed to maintain content.

One aspect of the present disclosure provides a memory device. The memory device includes a plurality of word lines and a controller configured to refresh a first word line and a first protected word line of the plurality of word lines during a first refresh cycle in response to a refresh signal, wherein the first protected word line is adjacent to a first accessed word line. The memory device further includes a random number generator configured to receive an address of the first word line and an address of the first accessed word line to generate a first number, and a counter electrically coupled to the random number generator. The counter is configured to receive the first number as an initial value of the counter, and configured to be turned on in response to the refresh signal. The controller is further configured to obtain an address of a second accessed word line being accessed when the counter counts down to zero, and refresh a second protected word line during a second refresh cycle, wherein the second protected word line is adjacent to the second accessed word line.

Another aspect of the present disclosure provides a memory device. The memory device includes a plurality of word lines, a controller configured to refresh a first word line and adjacent word lines of a first accessed word line of the plurality of word lines during a first refresh cycle in response to a refresh signal, a random number generator configured to generate a first number based on the address of the first word line and the address of the first accessed word line, a counter electrically coupled to the random number generator, wherein the counter is configured to receive the first number as an initial value of the counter, and start counting down in response to the refresh signal, and an address register electrically coupled to the counter, wherein the address register is configured to store an address of a second accessed word line being active when the counter counts down to zero. The controller is configured to access the address register to obtain the address of the second accessed word line, and protect adjacent word lines of the second accessed word line during a second refresh cycle.

Another aspect of the present disclosure provides a method for protecting a memory device, wherein the memory device includes a plurality of word lines. The method includes refreshing a first word line and a first protected word line of the plurality of word lines during a first refresh cycle in response to a refresh signal, wherein the first protected word line is adjacent to a first accessed word line; generating a first number by a random number generator based on an address of the first word line and an address of the first accessed word line; starting counting down from the first number by a counter in response to the refresh signal; obtaining, by a controller, an address of a second accessed word line being accessed when the counter counts to zero; protecting a second protected word line during a second refresh cycle, wherein the second protected word line is adjacent to the second accessed word line.

The embodiments of the present disclosure provide a memory device having a protection circuit for selecting and protecting a possible attacked word line. In particular, the protection circuit of the memory device can protect the word lines (memory cells) from row hammer. To trigger the row hammer, a malicious operator rapidly activates the same memory rows, such that the adjacent memory rows that are not activated may leak their charges. The present protection circuit provides a random number generator and a counter, so as to randomly select and protect a possible attacked memory row. The counter can be configured to count down from a random number generated by the random number generator. When the counter counts to zero, an address of the memory row that is activated can be obtained. In other words, the memory row is selected from those activated between refresh cycles. In such a case, the selection pool includes the memory rows activated between refresh cycles. The random number generator can generate the random number based on the address of the last refreshed word line address and the address of the last accessed word line (the selected possible attacked word line), such that the unpredictability of the random number increases. In addition, to avoid the random number generated by the random number generator exceeding the maximum number of activations between refresh cycles, the number trimmer modifies the random number to from zero to a predetermined number (i.e., the maximum number of activations between refresh cycles). Because the memory rows adjacent to those activated memory rows are more vulnerable to row hammer, they will be protected in the subsequent refresh cycle.

Generally, the activation amount triggering row hammer cannot be accomplished within two refresh cycles. For example, a memory device with 8192 rows can have about 170 activations between refresh cycles, and the activation amount for triggering the row hammer may be 10000 or more to the same row. Therefore, protecting additional memory row that possibly occurs row hammer in every refresh cycle can eliminate row hammer. Furthermore, the memory device can include a number trimmer to determine whether the random number, for choosing a particular one from memory rows, exceeds the maximum number of activations between refresh cycles (i.e., 170 in this case), and then decrease the random number to be in a range of 0 to 170. Accordingly, security and performance of the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device, comprising:
   a plurality of word lines;
   a controller configured to refresh a first word line and a first protected word line of the plurality of word lines during a first refresh cycle in response to a refresh signal, wherein the first protected word line is adjacent to a first accessed word line;
   a random number generator configured to receive an address of the first word line and an address of the first accessed word line to generate a first number; and
   a counter electrically coupled to the random number generator, wherein the counter is configured to receive the first number as an initial value of the counter, and configured to be turned on in response to the refresh signal;
   wherein the controller is further configured to obtain an address of a second accessed word line being accessed when the counter counts down to zero, and refresh a second protected word line during a second refresh cycle, wherein the second protected word line is adjacent to the second accessed word line.

2. The memory device of claim 1, wherein the first number is a positive integer.

3. The memory device of claim 1, wherein the first number is represented by a binary sequence having more than 2 bits.

4. The memory device of claim 3, wherein the first number is represented by a binary sequence having 8 bits.

5. The memory device of claim 1, wherein the first number is less than a first predetermined number, wherein the first predetermined number is associated with a first time period for accessing a word line and a second time period between the first refresh cycle and the second refresh cycle.

6. The memory device of claim 5, further comprising a number trimmer configured to reset a most significant bit (msb) of the first number when the first number is greater than the first predetermined number.

7. The memory device of claim 1, the random number generator includes a XOR gate.

8. The memory device of claim 1, wherein the address of the first word line and the address of the first accessed word line are each represented by a hexadecimal sequence having 4 bits.

9. The memory device of claim 8, wherein the random number generator is configured to generate the first number based on a first part of the address of the first word line and a first part of the address of the first accessed word line.

10. The memory device of claim 1, further comprising an address register electrically connected to the counter, wherein the address register is configured to obtain and store the address of the first accessed word line that is accessed when the counter decrements to zero.

11. The memory device of claim 1, wherein the controller is further configured to refresh a second word line during the second refresh cycle.

12. A memory device, comprising:
a plurality of word lines;
a controller configured to refresh a first word line and adjacent word lines of a first accessed word line of the plurality of word lines during a first refresh cycle in response to a refresh signal;
a random number generator configured to generate a first number based on the address of the first word line and the address of the first accessed word line;
a counter electrically coupled to the random number generator, wherein the counter is configured to receive the first number as an initial value of the counter, and start counting down in response to the refresh signal; and
an address register electrically coupled to the counter, wherein the address register is configured to store an address of a second accessed word line being active when the counter counts down to zero;
wherein the controller is further configured to access the address register to obtain the address of the second accessed word line, and protect adjacent word lines of the second accessed word line during a second refresh cycle.

13. The memory device of claim 12, wherein the first number is a positive integer.

14. The memory device of claim 12, wherein the first number is represented by a binary sequence having more than 2 bits.

15. The memory device of claim 14, wherein the first number is represented by a binary sequence having 8 bits.

16. The memory device of claim 12, wherein the first number is less than a first predetermined number, wherein the first predetermined number is associated with a first time period for accessing a word line and a second time period between the first refresh cycle and the second refresh cycle.

17. The memory device of claim 16, further comprising a number trimmer configured to reset a most significant bit (msb) of the first number when the first number is greater than the first predetermined number.

18. The memory device of claim 12, the random number generator includes a XOR gate.

19. The memory device of claim 12, wherein the address of the first word line and the address of the first accessed word line are each represented by a hexadecimal sequence having 4 bits.

20. The memory device of claim 19, wherein the random number generator is configured to generate the first number based on a first part of the address of the first word line and a first part of the address of the first accessed word line.

* * * * *